United States Patent
Wang et al.

(10) Patent No.: US 8,591,692 B2
(45) Date of Patent: Nov. 26, 2013

(54) METHOD FOR MANUFACTURING RIGID-FLEXIBLE PRINTED CIRCUIT BOARD

(75) Inventors: Ming-De Wang, Shenzhen (CN); Li Huang, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 121 days.

(21) Appl. No.: 13/207,438

(22) Filed: Aug. 11, 2011

(65) Prior Publication Data

US 2012/0097326 A1    Apr. 26, 2012

(30) Foreign Application Priority Data

Oct. 20, 2010    (CN) .......................... 2010 1 0513027

(51) Int. Cl.
*B32B 37/00*    (2006.01)
*B29C 65/00*    (2006.01)

(52) U.S. Cl.
USPC .............. 156/267; 156/291; 156/292; 29/830

(58) Field of Classification Search
USPC .............. 156/257, 247, 248, 250, 256, 272.8, 156/291, 292, 308.4, 267, 268, 253; 29/830, 831
See application file for complete search history.

(56) References Cited

U.S. PATENT DOCUMENTS 4,338,149 A * 7/1982 Quaschner ..................... 156/248
4,872,934 A * 10/1989 Kameda ......................... 156/250
4,931,134 A * 6/1990 Hatkevitz et al. ............... 216/17

FOREIGN PATENT DOCUMENTS

JP           05090756 A  *  4/1993
TW          200630006         8/2006

OTHER PUBLICATIONS

Machine translation of JP 05-090756 date unknown.*

* cited by examiner

*Primary Examiner* — John Goff
(74) *Attorney, Agent, or Firm* — Altis Law Group, Inc.

(57) ABSTRACT

A method for manufacturing a rigid-flexible printed circuit board includes certain steps. A flexible substrate including an exposed portion and an attaching portion is provided. An adhesive sheet defining an opening, and a rigid copper clad laminate are provided. The rigid copper clad laminate includes an insulating layer and a copper layer. A blind first slit is defined in the insulating layer. The flexible substrate, the adhesive sheet and the copper clad laminate are laminated. An outer circuit is formed in the copper layer. A second slit is defined in the copper clad laminate, and the second slit is in communication with the first slit. A portion of the copper clad laminate is removed to expose the flexible portion of the flexible substrate.

6 Claims, 7 Drawing Sheets

METHOD FOR MANUFACTURING RIGID-FLEXIBLE PRINTED CIRCUIT BOARD

BACKGROUND

1. Technical Field

The present disclosure generally relates to printed circuit boards (PCBs), and particularly, relates to a method for manufacturing a rigid-flexible printed circuit board.

2. Description of Related Art

Rigid-flexible printed circuit boards (R-F PCBs) are widely used in electronic devices. A rigid-flexible printed circuit board has a rigid region and a flexible region. The rigid region is configured for assembling electronic components and maintaining electrical connections among the electronic components. The flexible region is connected to the rigid region and can be bent relative to the rigid region. Thus, a number of electronic components can be assembled on the rigid region of the rigid flexible printed circuit board without occupying too much space.

A rigid-flexible printed circuit board is generally formed by laminating a rigid substrate to a flexible substrate which has an electrically conductive circuit. Before laminating, an opening is formed in the rigid substrate to expose one portion of the flexible substrate. As a result of the difference in respective thicknesses between the exposed portion of flexible substrate and the flexible substrate laminated together with the rigid substrate, the exposed portion of the flexible may wrinkle or crinkle, thereby causing a break(s) in the electrically conductive circuit of the exposed portion of flexible substrate.

What is needed, therefore, is a method for manufacturing a rigid-flexible printed circuit board which overcomes the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

FIG. 1a is a cross-sectional view of a flexible substrate including an exposed portion and an attaching portion in accordance with a first embodiment.

DETAILED DESCRIPTION

Embodiments are now described in detail and with reference to the drawings.

Referring to FIGS. 1-7, a method for manufacturing an R-F PCB which is provided in an illustrative embodiment includes the following steps.

Figure 1:
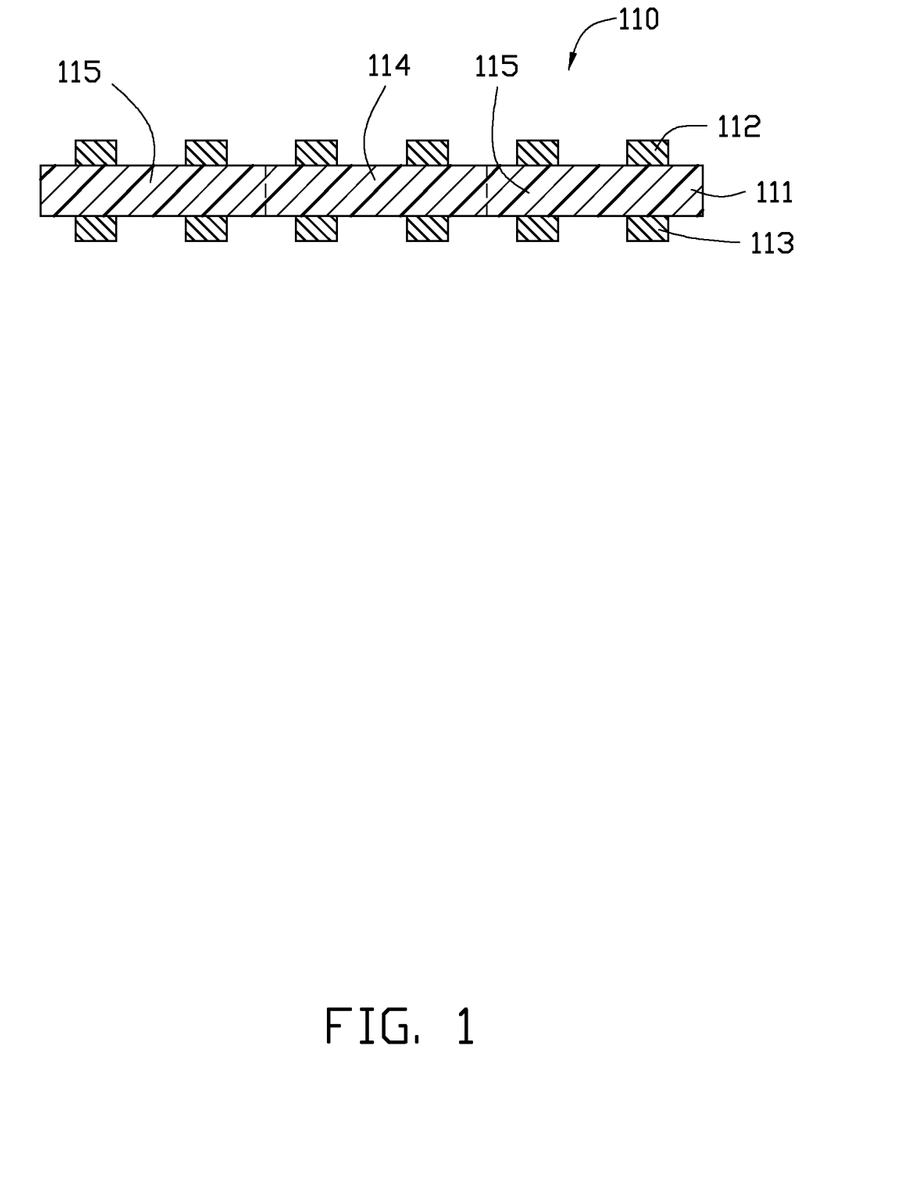

In Step 1: a flexible substrate 110 is provided.

Referring to FIG. 1, in the illustrative embodiment, the flexible substrate 110 includes a first insulating layer 111, a first electrically conductive circuit 112 and a second electrically conductive circuit 113. The first electrically conductive circuit 112 and the second electrically conductive circuit 113 are respectively formed on two opposite surfaces of the insulating layer 111. The flexible substrate 110 defines an exposed portion 114 and two attaching portions 115 connecting to the two opposite sides of the exposed portion 114. The first electrically conductive circuit 112 and the second electrically conductive circuit 113 are respectively distributed in the exposed portion 114 and the attaching portions 115.

Figure 2:
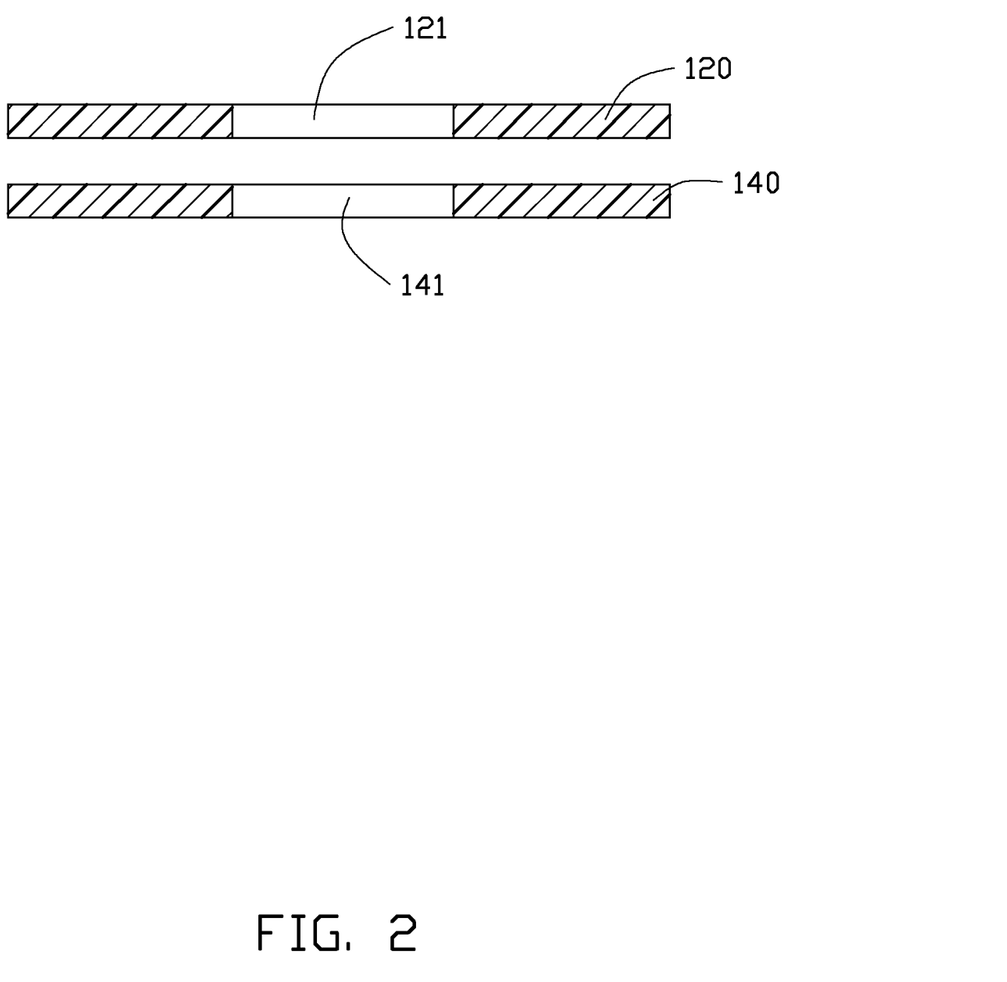
FIG. 2 is a cross-sectional view of a first adhesive sheet having a first opening therein and a second adhesive sheet having a second opening therein.
Figure 3:
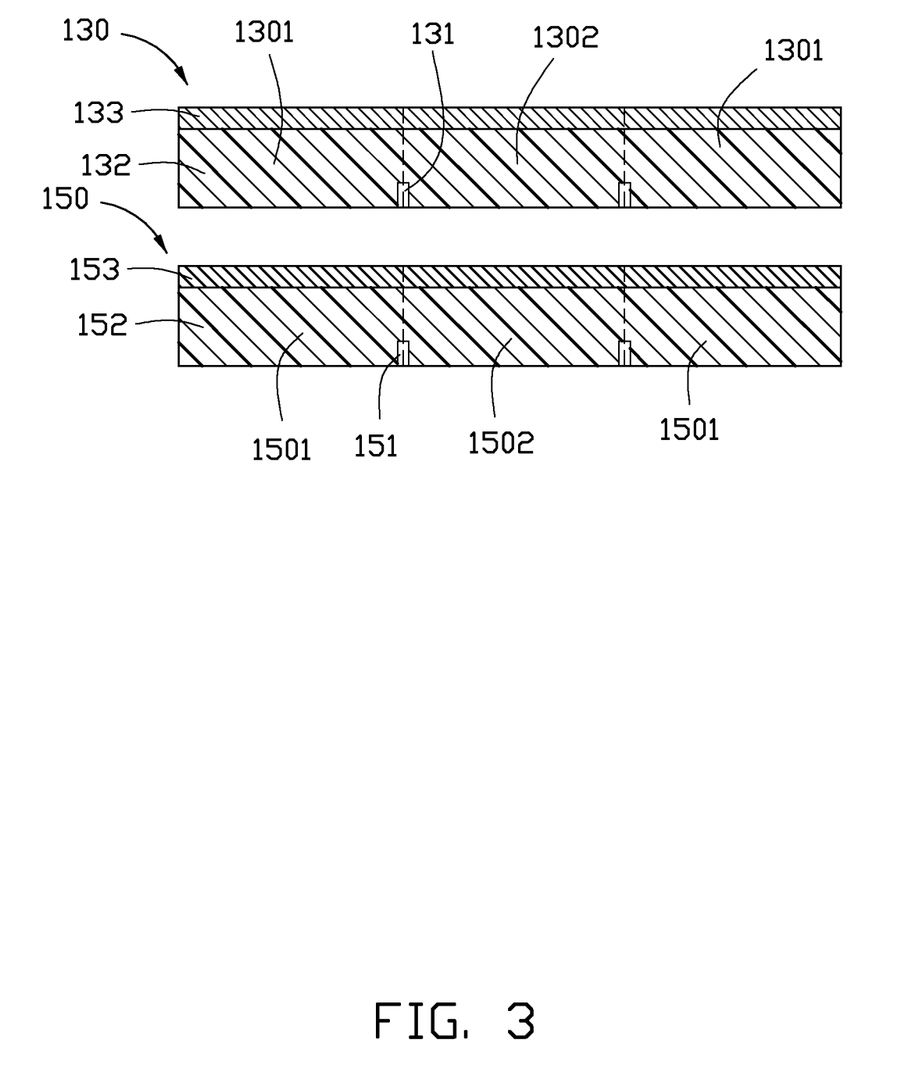
FIG. 3 is a cross-sectional view of a first copper clad laminate and a second copper clad laminate, the first copper clad laminate including a first product portion and a first unwanted portion, a first slit being defined in the first copper clad laminate along the boundary between the first product portion and the first unwanted portion, the second copper clad laminate including a second product portion and a second unwanted portion, a second slit being defined in the second copper clad laminate along the boundary between the second product portion and the second unwanted portion.

In Step 2, referring to FIGS. 2 and 3, a first adhesive sheet 120, a first copper clad laminate 130, a second adhesive sheet 140 and a second copper clad laminate 150 are provided. A first opening 121 is defined in the first adhesive sheet 120. A second opening 141 is defined in the second adhesive sheet 140. The shapes of the first opening 121 and the second opening 141 respectively correspond to the shape of the exposed portion 114. A first slit 131 is defined in the first copper clad laminate 130. A second slit 151 is defined in the second copper clad laminate 150. The shapes of the first slit 131 and the second slit 151 respectively correspond to the boundaries between the exposed portion 114 and the attaching portions 115.

The first adhesive sheet 120 and the second adhesive sheet 140 are fiber or other suitable product pre-impregnated with resin. The first opening 121 and the second opening 141 can be formed using a laser beam.

The first copper clad laminate 130 and the second copper clad laminate 150 are rigid. The first copper clad laminate 130 includes a second insulating layer 132 and a first copper layer 133. The first copper clad laminate 130 defines a first product portion 1301 and a first unwanted portion 1302. The first product portion 1301 corresponds to the attaching portion 115 of the flexible substrate 110. The first unwanted portion 1302 corresponds to the exposed portion 114. The first slit 131 is formed in the second insulating layer 132 and along the boundary between the first product portion 1301 and the unwanted portion 1302. The first slit 131 is defined in a surface of the second insulating layer 132 facing away from the first copper layer 133, and is blind, that is to say, the depth of the first slit 131 is less than the thickness of the second insulating layer 132. The ratio of the depth of the first slit 131 to the thickness of the second insulating layer 132 is in the range of ¼ to ½ and is optimal at ⅓. The width of the first slit 131 is in the range of 0.1 mm to 0.4 mm.

The second copper clad laminate 150 is identical to the first copper clad laminate 130. A third insulating layer 152, a second copper layer 153, a second product portion 1501, a second unwanted portion 1502 and a second slit 151 of the second copper clad laminate 150 respectively correspond to the second insulating layer 132, the first copper layer 133, a first product portion 1301, a first unwanted portion 1302 and the first slit 131 of the first copper clad laminate 130.

Figure 4:
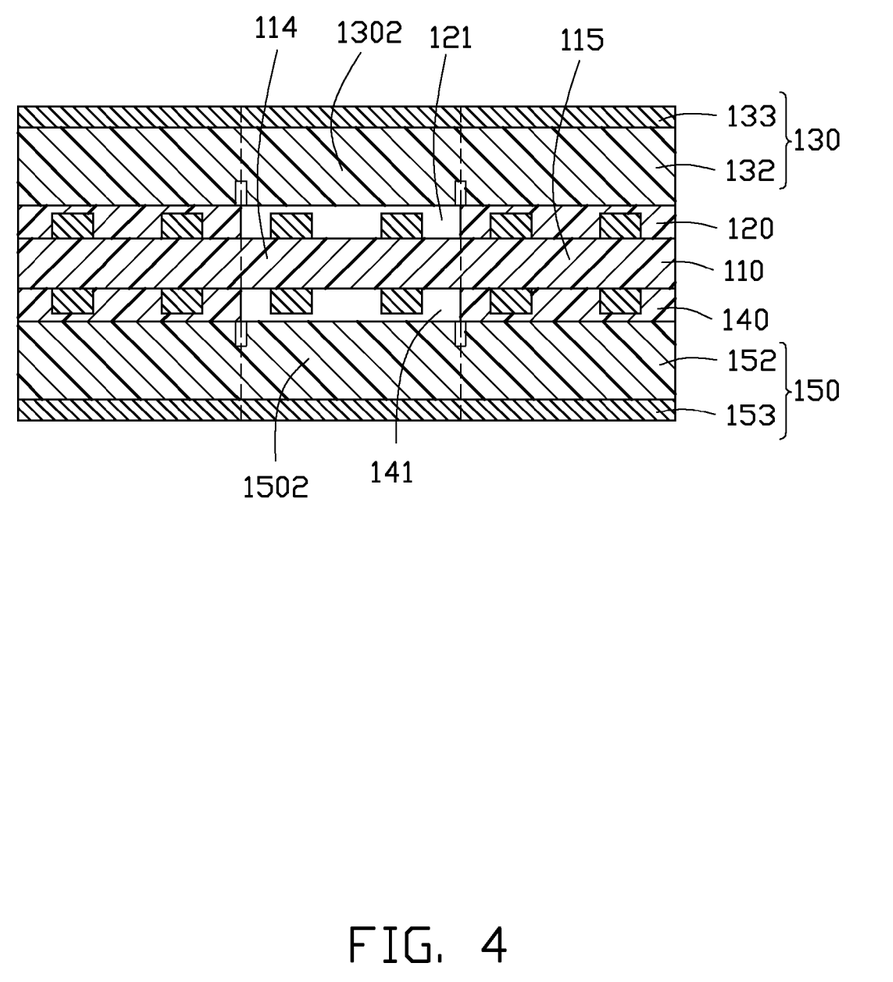
FIG. 4 is similar to FIG. 1, but shows the first copper clad laminate, the first adhesive sheet, the flexible substrate, the second adhesive sheet and the second copper clad laminate laminated in the above-described sequence.

In Step 3, referring to FIG. 4, the first copper clad laminate 130, the first adhesive sheet 120, the flexible substrate 110, the second adhesive sheet 140 and the second copper clad laminate 150 are laminated in the above-described sequence. The second insulating layer 132 adjoins the first adhesive sheet 120, and the third insulating layer 152 adjoins the second adhesive sheet 140. The first opening 121 and the second opening 141 respectively align with the exposed portion 114 of the flexible substrate 110. The first slit 131 and the second slit 151 are aligned with the boundary between the exposed portion 114 and the attaching portion 115 of the flexible substrate 110.

As the first unwanted portion 1301 and the second unwanted portion 1501 are not removed, the surfaces of the first copper clad laminate 130 and the second copper clad laminate 150 are flat during the laminating process, thus the exposed portion 114 of the flexible substrate 110 will not crinkle or deform, thus the first electrically conductive circuit 112 and the second electrically conductive circuit 113 of the flexible substrate 110 will not be broken.

Figure 5:
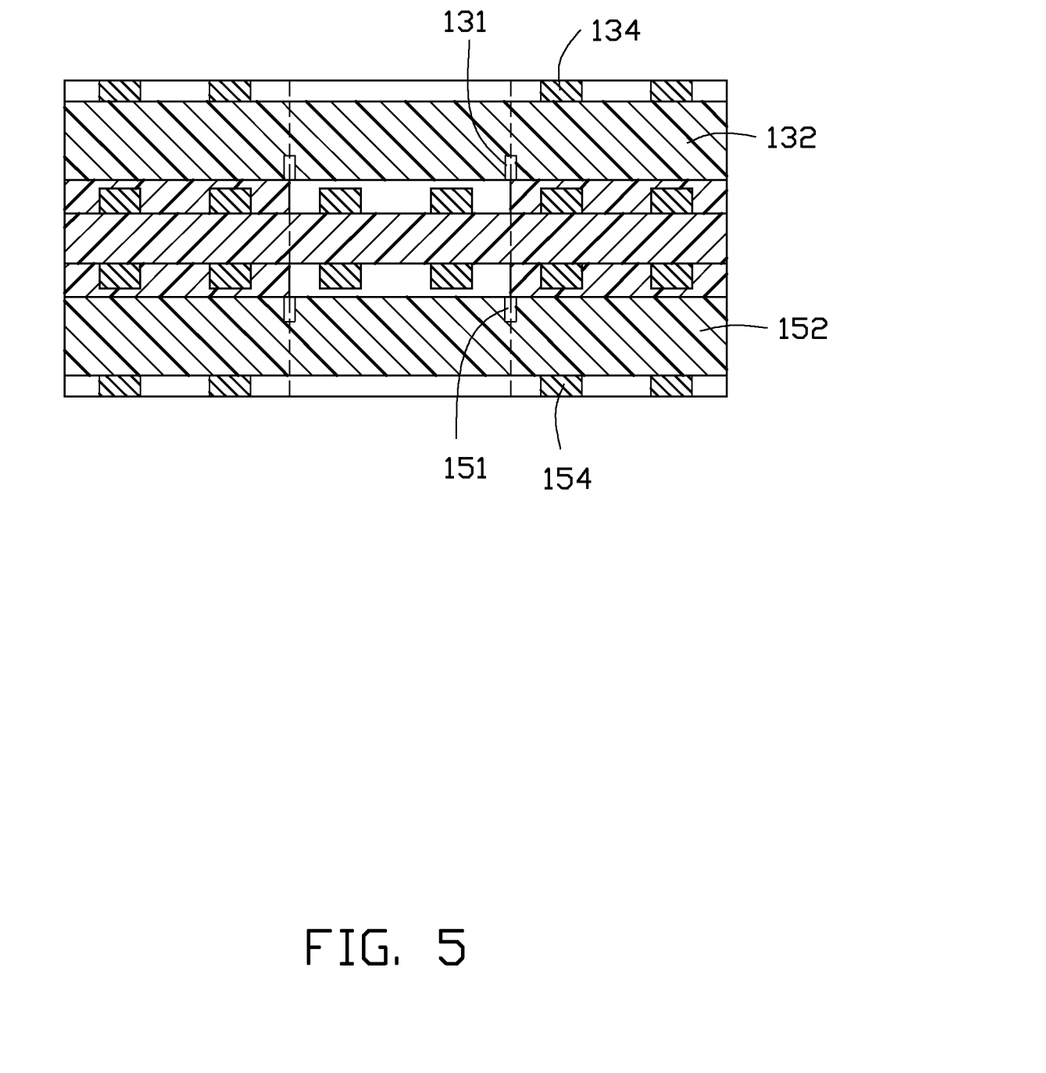
FIG. 5 is similar to FIG. 4, but shows a first outer circuit formed in the first copper clad laminate and a second outer circuit formed in the second copper clad laminate.

In Step 4, referring to FIG. 5, a first outer circuit 134 is formed by removing part of the first copper layer 133, and a second outer circuit 154 is formed by removing part of the second copper layer 153.

The first outer circuit 134 and the second outer circuit 154 may be formed by using a photolithography process and an etching process. As a result of the exposed portion 114 of the flexible substrate 110 being covered by the second insulating layer 132 and the third insulating layer 152, the reagents used in the photolithography process and in the etching process can not get to and attack the flexible substrate 110. Thus there will be no corrosion of the first electrically conductive circuit 112 and the second electrically conductive circuit 113. In the illustrative embodiment, when forming the first outer circuit 134 and the second outer layer 154, the first copper layer 133 in the first unwanted portion 1302 and the second copper layer 153 in the second unwanted portion 1502 are removed simultaneously.

Figure 6:
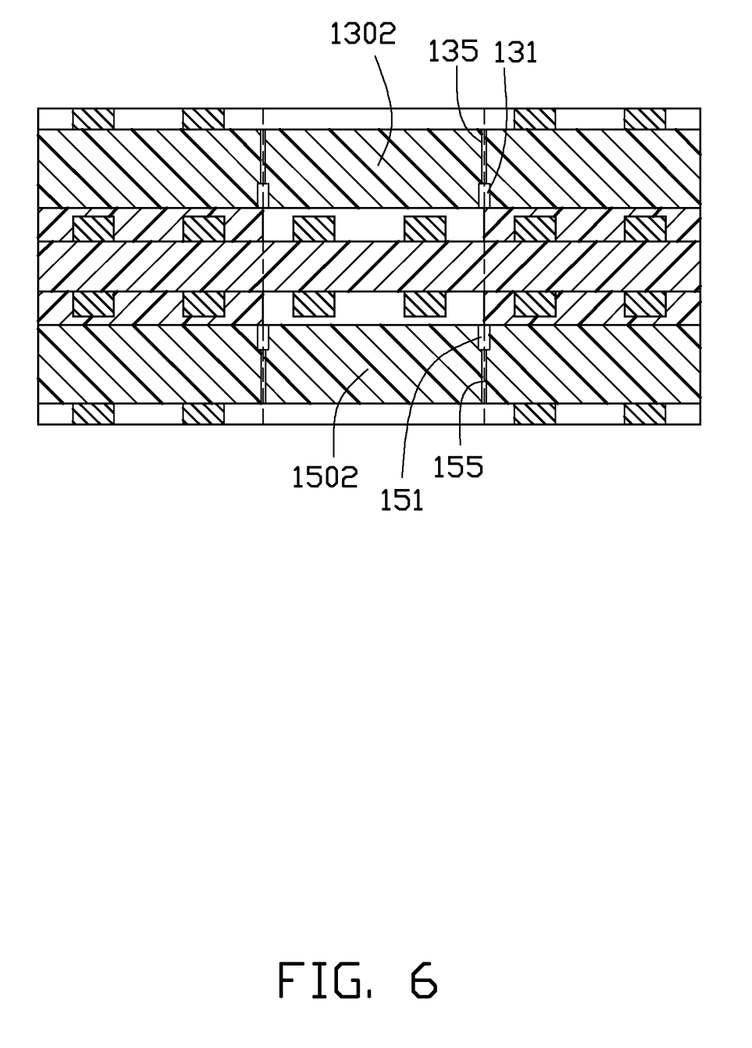
FIG. 6 is similar to FIG. 5, but shows a third slit formed in the first copper clad laminate and a fourth slit formed in the second copper clad laminate, the third slit communicates with the first slit, and the fourth slit communicates with the second slit.

In Step 5, referring to FIG. 6, a third slit 135 is defined in the second insulating layer 132 along the boundary of the first product portion 1301 and the first unwanted portion 1302, and is in communication with the first slit 131. A fourth slit 155 is defined in the third insulating layer 152 along the boundary of the second product portion 1501 and the second unwanted portion 1502, and is in communication with the second slit 151.

The third slit 135 and the fourth slit 155 are formed using a laser beam. The depth of each of the third slit 135 and fourth slit 155 can be controlled by adjusting the output power of the laser. The depth of the third slit 135 is approximately equal to one half to three quarters of the thickness of the second insulating layer 132. The depth of the fourth slit 155 is approximately equal to ½ to ¾ of the thickness of the third insulating layer 152. The width of the third slit 135 is smaller than that of the first slit 131. The width of the fourth slit 155 is smaller than that of the second slit 151. As the first slit 131 and the third slit 151 are respectively formed in the second insulating layer 132 and the third insulating layer 152, damage to the flexible substrate 110 by a high-power laser is avoided when forming the third slit 135 and the fourth slit 155.

As the first slit 131 and the third slit 135 are in communication with each other, the first unwanted portion 1302 and the first product portion 1301 are separated from each other. As the second slit 151 and the fourth slit 155 are in communication with each other, the second unwanted portion 1502 and the second product portion 1501 are separated from each other.

Figure 7:
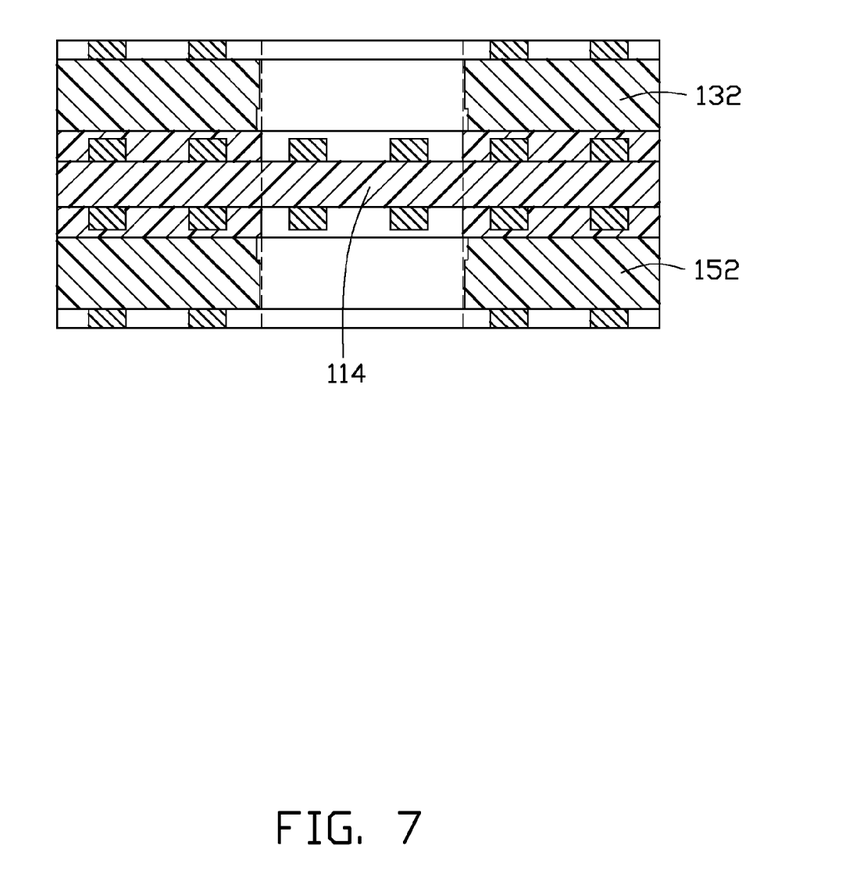
FIG. 7 is similar to FIG. 6, but shows the first unwanted portion of the first copper clad laminate and the second unwanted portion of the second copper clad laminate removed.

In Step 6, referring to FIG. 7, the first unwanted portion 1302 of the first copper clad laminate 130 and the second unwanted portion 1502 of the second copper clad laminate 150 are removed so as to expose the exposed portion 114, thus a rigid-flexible printed circuit board is obtained.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A method for manufacturing rigid-flexible printed circuit board, comprising:
   providing a flexible substrate comprising an exposed portion and an attaching portion connecting with the exposed portion;
   providing an adhesive sheet and a rigid copper clad laminate, the adhesive sheet including an opening corresponding to the exposed portion, the rigid copper clad laminate comprising an insulating layer and a copper layer, the rigid copper clad laminate comprising a product portion corresponding to the attaching portion and an unwanted portion corresponding to the exposed portion;
   defining a first blind slit in the insulating layer along a boundary between the product portion and the unwanted portion, the first slit being defined in a surface of the insulating layer facing away from the copper layer, a width of the first slit being in the range from 0.1 mm to 0.4 mm;
   laminating the rigid copper clad laminate, the adhesive sheet and the flexible substrate together, the adhesive sheet superposed on the attaching portion of the flexible substrate, the insulating layer adjoining the adhesive sheet, the unwanted portion of the rigid copper clad laminate superposed on the exposed portion of the flexible substrate;
   forming an outer circuit in the copper layer;
   defining a second slit in the rigid copper clad laminate along the boundary between the product portion and the unwanted portion, the second slit being in communication with the first slit, a width of the first slit being larger than that of the second slit, a width of the second slit being in the range from 0.1 mm to 0.2 mm; and
   removing the unwanted portion of the rigid copper clad laminate to expose the exposed portion of the flexible substrate, thus obtaining a rigid-flexible printed circuit board.

2. The method as claimed in claim 1, wherein a depth of the first slit is in the range from one quarter to a half of the thickness of the insulating layer, a depth of the second slit is in the range from a half to three quarters of the thickness of the insulating layer.

3. The method as claimed in claim 1, wherein the first slit and the second slit are formed using a laser beam.

4. A method for manufacturing rigid-flexible printed circuit board, comprising:

provided an flexible substrate comprising an exposed portion and an attaching portion connecting with the exposed portion;

providing a first adhesive sheet, a second adhesive sheet, a first copper clad laminate and a second copper clad laminate, the first adhesive sheet including a first opening corresponding to the exposed portion of the flexible substrate, the second adhesive sheet including a second opening corresponding to the exposed portion of the flexible substrate, the first and second copper clad laminates being rigid, the first copper clad laminate comprising a first insulating layer and a first copper layer, the first copper clad laminate including a first product portion corresponding to the attaching portion and a first unwanted portion corresponding to the exposed portion, the second copper clad laminate comprising a second insulating layer and a second copper layer, the second copper clad laminate including a second product portion corresponding to the attaching portion and a second unwanted portion corresponding to the exposed portion;

defining a first blind slit in the first insulating layer along a boundary between the first product portion and the first unwanted portion and a second blind slit in the second insulating layer along a boundary between the second product portion and the second unwanted portion, the first slit being defined in a surface of the first insulating layer facing away from the first copper layer, the second slit being defined in a surface of the second insulating layer facing away from the second copper layer, a width of the first slit and a width of the second slit being in the range from 0.1 mm to 0.4 mm;

laminating the first copper clad laminate, the first adhesive sheet, the flexible substrate, the second adhesive sheet and the second copper clad laminate together, the first and the second adhesive sheets superposed on the attaching portion of the flexible substrate, the first insulating layer adjoining the first adhesive sheet, the second insulating layer adjoining the second adhesive sheet, the first and second unwanted portions superposed on the exposed portion of the flexible substrate;

forming a first outer circuit in the first copper layer and a second outer circuit in the second copper layer;

defining a third slit in the first copper clad laminate along the boundary between the first product portion and the first unwanted portion and a fourth slit in the second laminate along the boundary between the second product portion and the second unwanted portion, the third slit being communication with the first slit, the fourth slit being communication with the second slit, the width of the first slit being larger than that of the third slit, the width of the second slit being larger than that of the fourth slit, the width of the third slit and the width of the fourth slit being in the range from 0.1 mm to 0.2 mm; and removing the first unwanted portion of the first copper clad laminate and the second unwanted portion of the second copper clad laminate to expose the exposed portion of the flexible substrate, thus obtaining a rigid-flexible printed circuit board.

5. The method as claimed in claim 4, wherein a depth of the first slit is in the range from one quarter to a half of the thickness of the first insulating layer, a depth of the second slit is in the range from one quarter to a half of the thickness of the second insulating layer.

6. The method as claimed in claim 4, wherein the first slit, the second slit, the third slit and the fourth slit are formed using a laser beam.

* * * * *